United States Patent
Lin et al.

(10) Patent No.: US 9,543,185 B2
(45) Date of Patent: Jan. 10, 2017

(54) PACKAGING PROCESS TOOLS AND SYSTEMS, AND PACKAGING METHODS FOR SEMICONDUCTOR DEVICES

(75) Inventors: Wei-Hung Lin, Xinfeng Township (TW); Kuei-Wei Huang, Hsin-Chu (TW); Chih-Wei Lin, Xinfeng Township (TW); Chun-Cheng Lin, New Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1435 days.

(21) Appl. No.: 13/309,311

(22) Filed: Dec. 1, 2011

(65) Prior Publication Data
US 2013/0143361 A1    Jun. 6, 2013

(51) Int. Cl.
*B23Q 3/00*     (2006.01)
*H01L 21/683*    (2006.01)
(Continued)

(52) U.S. Cl.
CPC .......... *H01L 21/6835* (2013.01); *H01L 24/81* (2013.01); *H01L 24/97* (2013.01); *H01L 21/563* (2013.01); *H01L 23/3128* (2013.01); *H01L 24/05* (2013.01); *H01L 24/11* (2013.01); *H01L 24/13* (2013.01); *H01L 24/14* (2013.01); *H01L 24/16* (2013.01); *H01L 24/83* (2013.01); *H01L 2221/68372* (2013.01); *H01L 2224/0401* (2013.01); *H01L 2224/1145* (2013.01); *H01L 2224/11444* (2013.01); *H01L 2224/11452* (2013.01); *H01L 2224/11462* (2013.01); *H01L 2224/13082* (2013.01); *H01L 2224/13083* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/14135* (2013.01); *H01L 2224/16225* (2013.01); *H01L 2224/73204* (2013.01); *H01L 2224/81001* (2013.01); *H01L 2224/81191* (2013.01); *H01L 2224/81203* (2013.01); *H01L 2224/81815* (2013.01); *H01L 2224/81907* (2013.01); *H01L 2224/83102* (2013.01); *H01L 2224/9205* (2013.01);
(Continued)

(58) Field of Classification Search
CPC .......................... H05K 13/0069; B23Q 16/001
See application file for complete search history.

(56) References Cited

U.S. PATENT DOCUMENTS 4,321,588 A * 3/1982 Gabor .................. H05K 7/02
                                          340/815.47
4,438,560 A * 3/1984 Kisters ................ H05K 1/0287
                                            174/265
(Continued)

*Primary Examiner* — Lee D Wilson
(74) *Attorney, Agent, or Firm* — Slater Matsil, LLP

(57) ABSTRACT

Packaging process tools and systems, and packaging methods for semiconductor devices are disclosed. In one embodiment, a packaging process tool for semiconductor devices includes a mechanical structure for supporting package substrates or integrated circuit die during a packaging process for the integrated circuit die. The mechanical structure includes a low thermal conductivity material disposed thereon.

20 Claims, 5 Drawing Sheets

(51) Int. Cl.
    *H01L 23/31*     (2006.01)
    *H01L 23/00*     (2006.01)
    *H01L 21/56*     (2006.01)

(52) U.S. Cl.
    CPC ............ *H01L 2224/92125* (2013.01); *H01L 2224/95001* (2013.01); *H01L 2924/15311* (2013.01); *H01L 2924/181* (2013.01); *H01L 2924/3511* (2013.01); *H01L 2924/3512* (2013.01); *H01L 2924/3841* (2013.01)

(56) References Cited

U.S. PATENT DOCUMENTS

| | | | | | |
|---|---|---|---|---|---|
| 4,552,422 | A | * | 11/1985 | Bennett | H05K 7/1084 361/783 |
| 5,012,924 | A | * | 5/1991 | Murphy | H05K 13/021 206/719 |
| 5,257,166 | A | * | 10/1993 | Marui | G01R 1/04 174/260 |
| 5,438,740 | A | * | 8/1995 | Carr | B25B 5/06 198/345.3 |
| 8,786,068 | B1 | * | 7/2014 | Phillips | H01L 24/34 257/666 |

* cited by examiner

PACKAGING PROCESS TOOLS AND SYSTEMS, AND PACKAGING METHODS FOR SEMICONDUCTOR DEVICES

CROSS-REFERENCE TO RELATED APPLICATIONS

This application relates to the following co-pending and commonly assigned patent application: Ser. No. 13/270,890, filed on Oct. 11, 2011 entitled, "Packaging Process Tools and Packaging Methods for Semiconductor Devices," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip (FC) ball grid array (BGA) package, in which semiconductor die are placed upside-down on a substrate and bonded to the substrate using micro-bumps. The substrate has wiring routed to connect the micro-bumps on the die to contact pads on the substrate that have a larger footprint. An array of solder balls is formed on the opposite side of the substrate and is used to electrically connect the packaged die to an end application.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related generally to semiconductor devices, and more particularly to the packaging of integrated circuits. Novel packaging techniques for semiconductor devices are disclosed, wherein a packaging process tool comprises a support for a packaging substrate, a jig, or both a support for a packaging substrate and a jig, that reduce or eliminate warpage during packaging processes such as thermal cycling and solder reflow processes.

Figure 1:
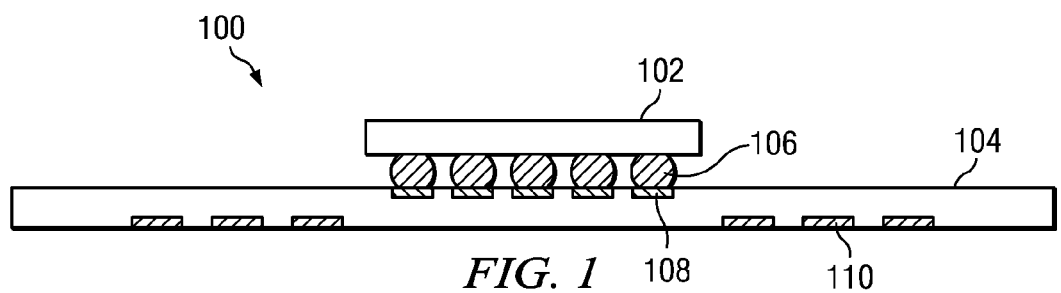
FIG. 1 shows a cross-sectional view of an integrated circuit die attached to a packaging substrate according with an embodiment of the present disclosure.

FIG. 1 shows a cross-sectional view of a semiconductor device 100 wherein an integrated circuit die 102 is attached to a packaging substrate 104 in accordance with an embodiment of the present disclosure. To package the integrated circuit die 102, first, a packaging substrate 104 is provided. The packaging substrate 104 may comprise a ceramic, plastic, silicon, print circuit board (PCB), and/or organic material, as examples, although alternatively, the packaging substrate 104 may comprise other materials. The packaging substrate 104 may comprise a substrate for a flip-chip ball grid array (FC-BGA) package, flip-chip chip scale package (FC-CSP), land grid array (LGA) package, or bond-on-trace (BOT) package, as examples, although alternatively, other types of packaging substrates 104 may be used. The packaging substrate 104 is also referred to herein as a substrate 104.

A plurality of integrated circuit dies 102 is also provided. Only one integrated circuit die 102 is shown in FIG. 1; however, a plurality of dies 102 is attached to the surface of the packaging substrate 104, elsewhere on the packaging substrate 104. The integrated circuit dies 102 may comprise a plurality of circuits and electrical components formed thereon, not shown. The integrated circuit dies 102 may have been previously fabricated on a semiconductor wafer or workpiece (not shown in FIG. 1; see FIG. 2 at 101) comprising a semiconductor material such as silicon or other semiconductors and singulated on scribe lines to form a plurality of single dies 102, for example. The integrated circuit dies 102 may comprise a shape of a square or rectangle in a top view (not shown in FIG. 1; see the perspective views of FIGS. 3 and 4). The integrated circuit dies 102 are also referred to herein as dies or semiconductor devices, for example. A plurality of bumps 106 is disposed on a surface of the integrated circuit die 102, wherein the bumps 106 comprise contacts for the integrated circuit die 102.

A plurality of bond pads 108 is disposed on the top surface of the packaging substrate 104. The bond pads 108 are adapted to be coupled to the bumps 106 of the integrated circuit die 102 and comprise a similar pattern as the bumps 106. A plurality of contact pads 110 is disposed on the bottom surface of the packaging substrate 104. The contact pads 110 are adapted to be coupled a plurality of solder balls 158 (not shown in FIG. 1; see FIG. 12) in some embodiments. Conductive wiring (not shown) may be disposed within insulating material layers (also not shown) of the packaging substrate 104. The conductive wiring is disposed between and electrically connects the plurality of contact pads 110 and the plurality of bond pads 108 of the packaging substrate 104. The conductive wiring, contact pads 110, and bond pads 108 may comprise electrical connections that are formed by lithography within the packaging substrate 104, for example. The electrical connections may comprise copper, aluminum, other metals, or multiple layers or combinations thereof, as examples. Some of the electrical connections may comprise a redistribution layer (RDL) (not shown) formed in the packaging substrate 104, e.g., proximate a surface of the substrate 104 in some embodiments. The RDL may include fan-out regions of wiring. The integrated circuit die 102 may be electrically coupled to the RDL of the substrate 104, for example.

Figure 2:
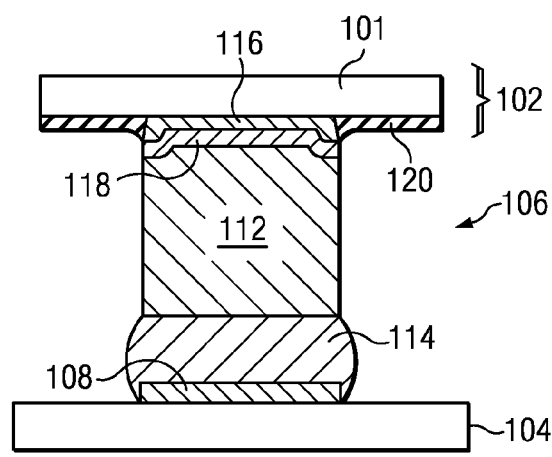
FIG. 2 shows a more detailed view of a bump of the integrated circuit die that will be soldered to a packaging substrate.

FIG. 2 shows a more detailed cross-sectional view of a portion of FIG. 1 including a bump 106 on the integrated circuit die 102. FIG. 2 illustrates a BOT joint in some embodiments, for example. The die 102 includes a workpiece 101 comprising silicon or other semiconductive material. The die 102 includes an insulating material 120 and conductive wiring 116 formed proximate the surface of the workpiece 101. The wiring 116 may be electrically coupled between the bumps 106 and electrical components (not shown) of the integrated circuit die 102, for example. The wiring 116 may comprise aluminum pads in some embodiments, for example, although other metals may be used. An under ball metallization (UBM) 118 structure may optionally be formed on the conductive wiring 116 of the die 102 to facilitate the attachment of the bumps 106.

In some embodiments, the bumps 106 comprise microbumps, for example. Each bump 106 may include an optional metal stud 112 that may comprise copper, a copper alloy, or other metals, and solder 114 formed over the metal stud 112. The bumps 106 may alternatively comprise other materials. The metal studs 112 may be formed of any suitable conductive material, including Cu, Ni, Pt, Al, combinations thereof, and may be formed through any number of suitable techniques, including PVD, CVD, electrochemical deposition (ECD), molecular beam epitaxy (MBE), atomic layer deposition (ALD), electroplating, and the like. An optional conductive cap layer may be formed between the metal stud 112 and the solder 114, not shown. For example, in an embodiment in which the metal stud 112 is formed of copper, a conductive cap layer formed of nickel may be desirable. Other materials, such as Pt, Au, Ag, combinations thereof, or the like, may also be used.

The solder 114 is formed over an end of the metal stud 112 and/or on the optional conductive cap layer. The solder 114 may also be directly formed on the wiring 116 or UBM 118 of the die 102, for example, in embodiments where a metal stud 112 and cap layer are not included. The solder 114 material may comprise SnPb, a high-Pb material, a Sn-based solder, a lead-free solder, or other suitable conductive materials, as examples. The bumps 106 may comprise a height (in a vertical direction in the drawings) of about 50 μm or less and a width of about 35 μm, for example, although the bumps 106 may also comprise other dimensions.

Figure 3:
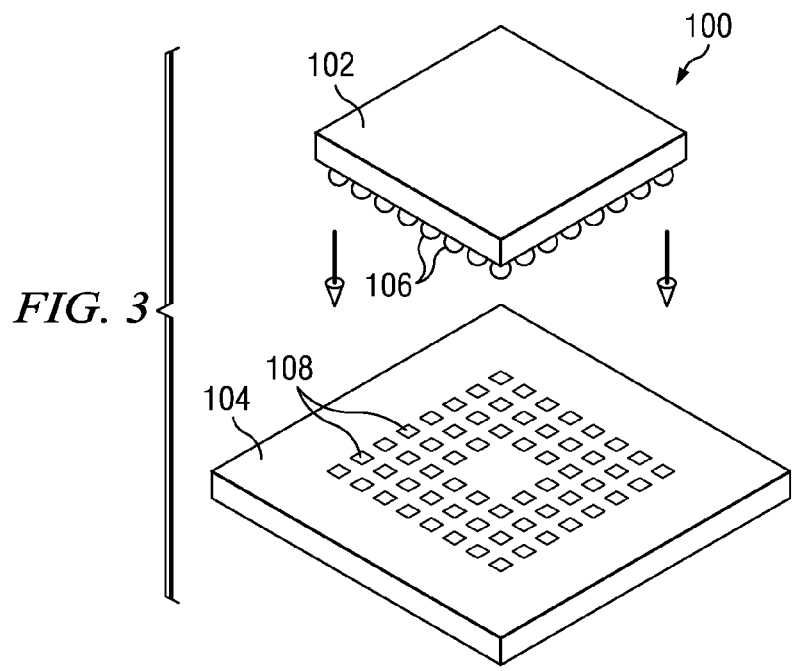
FIG. 3 shows a perspective view of an integrated circuit die being coupled to a packaging substrate according with embodiments.

FIG. 3 shows a perspective view of an integrated circuit die 102 being attached to a packaging substrate 104 to illustrate a possible arrangement of bumps 106 on a die 102. The integrated circuit die 102 includes a plurality of bumps 106 formed on a surface thereof. The bumps 106 are formed in a peripheral region of the die 102 and may be arranged in one or more rows in the peripheral region. As an example, the bumps 106 are arranged in three rows on each side of the integrated circuit die 102 in FIG. 3 (as can be seen by the pattern of the bond pads 108 on the packaging substrate 104), along a die 102 edge or corners. The bumps 106 may alternatively be arranged in other patterns and may be positioned in other locations. Other embodiments may utilize aspects with bump structures along interior portions of the die, for example. The placement of the bump structures are provided for illustrative purposes only and the specific locations and patterns of the bump structures may vary and may include, as examples, an array of bumps, lines of bumps in a middle region of the die 102, or staggered bumps. The illustrated die 102 and bump 106 sizes and placement are provided for reference only and are not intended to be actual sizes or actual relative sizes.

Figure 4:
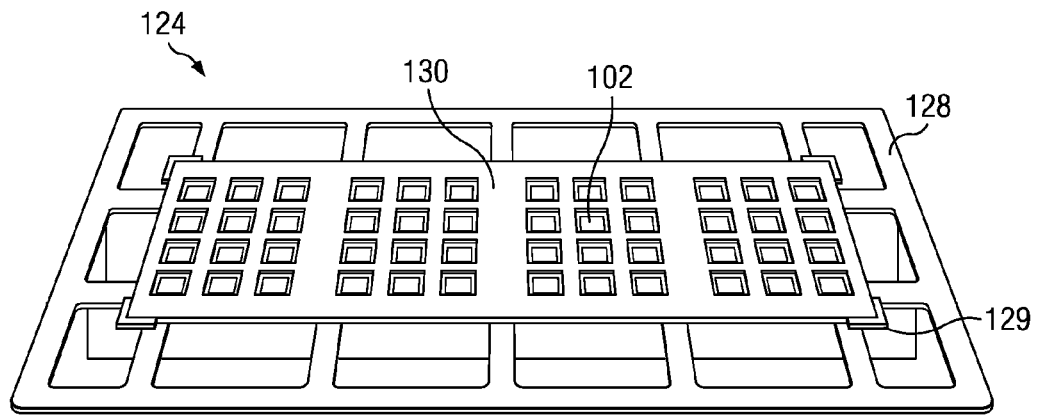
FIG. 4 is a perspective view of a packaging process system that includes a jig and a support for a packaging substrate in accordance with embodiments of the disclosure.

FIG. 4 shows a perspective view of a packaging process system 124 in accordance with an embodiment of the present disclosure that is used in a packaging process for an integrated circuit die 102 shown in FIGS. 1 through 3. The packaging process system 124 includes a packaging process tool for semiconductor devices 102 that has a mechanical structure for supporting package substrates (support 128 in FIG. 4) or a mechanical structure for supporting integrated circuit die 102 (jig 130 in FIG. 4) during a packaging process for the integrated circuit die 102, wherein the mechanical structure includes a low thermal conductivity material disposed thereon, to be described further herein.

The packaging process system 124 includes a support 128 for a packaging substrate 104 and a support 129 for the jig 130. The support 128 may comprise a supporting boat or other types of supports, for example. The support 128 is adapted to support a bottom surface of the packaging substrate 104 during a packaging process using the packaging process system 124. The support 129 for the jig 130 may be disposed proximate the support 128 for the packaging substrate 104 and may be coupled to the support 128 for the packaging substrate 104 in some embodiments. The support 129 for the jig 130 may comprise one or more brackets coupled to the support 128 for the packaging substrate 104 and may be coupleable to the corners and/or sides of the jig 130, e.g., by levers or latches. The supports 128 and 129 may alternatively comprise other configurations. For example, support 129 may comprise a hollow area (not shown) within support 128 that is adapted to reduce thermal loading during a solder reflow process.

The packaging process system 124 is adapted to be used to perform packaging processes on a packaging substrate 104 and integrated circuit dies 102. In some embodiments, the packaging processes may comprise thermal processes wherein the packaging substrate 104 and integrated circuit dies 102 are heated to an elevated temperature, for example. In some embodiments, the packaging processes comprise solder reflow processes.

The integrated circuit dies 102 shown in FIG. 4 are coupled beneath the jig 130 to a packaging substrate 104 (not visible in FIG. 4; see FIGS. 7 through 11) which is placed on the support 128 for the packaging substrate 104. The jig 130 is placed as a cover over the packaging substrate 104 between the integrated circuit dies 102 during appropriate times during the packaging process. The packaging substrate 104, jig 130, and support 128 may be substantially rectangular in a top view, or may comprise other shapes. The plurality of dies 102 are arranged in an array-like structure of columns and rows on the packaging substrate 104. The dies 102 on the packaging substrate 104 are arranged in groups, as shown, to provide unused areas on the packaging substrate 104 where the jig 130 during a solder flow process or other packaging process may be placed upon to facilitate in maintaining the position of the dies 102, for example.

Figure 5:
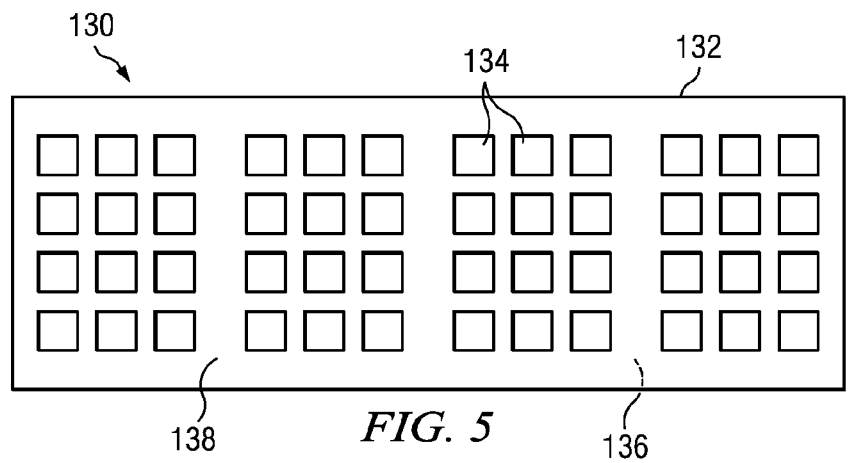
FIG. 5 shows a top view of the jig shown in FIG. 4.

FIG. 5 shows a top view of the jig 130. The jig 130 comprises a frame 132 that includes a plurality of apertures 134 formed therein. The apertures 134 are square or rectangular in shape and are slightly larger than the dies 102 that the jig 130 will be used to process. The frame 132 of the jig 130 is adapted to support or retain a plurality of integrated circuit dies 102 therein and to retain the dies 102 onto the packaging substrate 104 during a packaging process for the dies 102. The frame 132 has a first side 136 comprising a bottom side, and the frame 132 has a second side 138 opposite the first side 136. The second side 138 comprises a top side in the figures.

Figure 6:
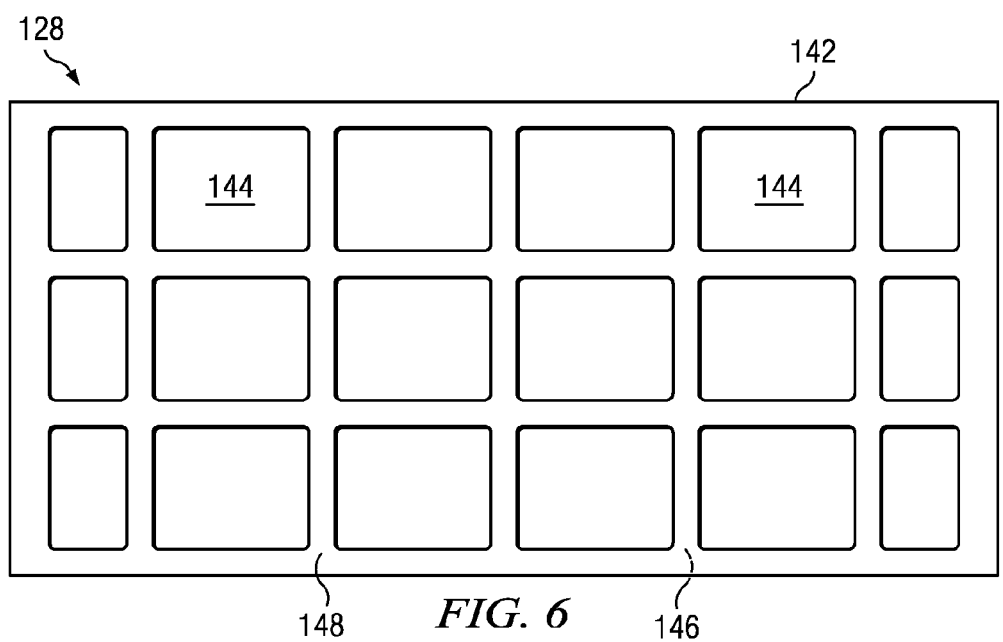
FIG. 6 shows a top view of the support for packaging substrate shown in FIG. 4.

FIG. 6 shows a top view of the support 128 for the packaging substrate 104. The support 128 also comprises a frame 142 which may be larger than the frame 132 of the jig 130, as can be seen in FIG. 4. The support 128 may include a plurality of apertures 144 to allow for cooling in the packaging process system 124 and/or for access to a bottom surface of the packaging substrate 104, for example. The frame 142 has a first side 146 comprising a top side, and the frame 142 has a second side 148 opposite the first side 146. The second side 148 comprises a bottom side in the figures.

The jig 130 and the support 128 are both collectively referred to as packaging process tools or mechanical structures herein. Either the jig 130, the support 128, or both the jig 130 and the support 128 include the low thermal conductivity material 150 disposed thereon in accordance with embodiments of the present disclosure, to be described further with reference to FIGS. 7 through 11. The frames 132 and 142 of the jig 130 and the support 128, respectively, may comprise stainless steel, aluminum, an aluminum alloy, magnesium, tungsten, titanium, chromium, copper, or a copper alloy, other metals or materials, or combinations thereof, as examples. The frames 132 and 142 of the jig 130 and the support 128, respectively, may comprise a thermal conductivity larger than about 15 watts per meter Kelvin [W/(m-K)], although alternatively, the frames 132 and 142 may comprise other ranges of thermal conductivity. The frames 132 and 142 may comprise stainless steel in some embodiments, which comprises a thermal conductivity of about 16 W/(m-K), for example.

In some embodiments, the frame 132 of the jig 130 comprises a first material, and the low thermal conductivity material 150 comprises a second material, wherein the second material is different than the first material, for example. The frames 132 and 142 of the jig 130 and the support 128, respectively, comprise materials having a different thermal conductivity than a thermal conductivity of the low thermal conductivity material 150, in other embodiments.

FIGS. 7 through 11 show several embodiments of the present disclosure. FIGS. 7 through 11 show cross-sectional views of a portion of the packaging process system 124 and an integrated circuit die or dies 102 positioned on a packaging substrate 104 which is disposed on a support 128 for the packaging substrate 104.

Figure 7:
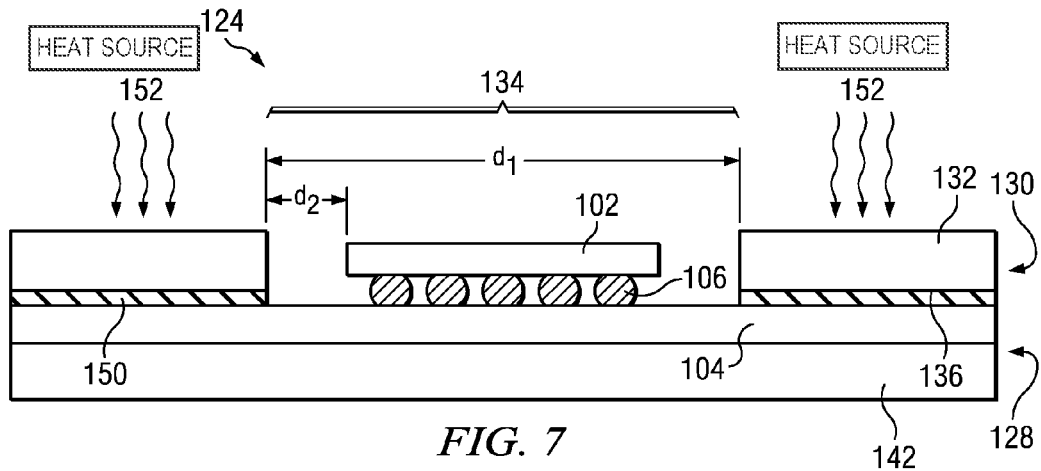
FIGS. 7 through 11 show cross-sectional views of a portion of the packaging process system and an integrated circuit die positioned on a packaging substrate on a support for processing in accordance with embodiments of the present disclosure, wherein a low thermal conductivity material is disposed on the support for the packaging substrate, on the jig, or on both the support and the jig.

In the embodiment shown in FIG. 7, the low thermal conductivity material 150 is disposed on the first side 136 of the jig 130. The low thermal conductivity material 150 is formed on the frame 132 of the jig 130, as shown. The low thermal conductivity material 150 may be attached to or deposited on the first side 136 of the jig 130, for example. The low thermal conductivity material 150 may also be coated on the first side 136 of the jig 130. The low thermal conductivity material 150 may comprise a ceramic material, an organic material, a plastic material, silicone rubber, or combinations thereof, for example. The low thermal conductivity material 150 may comprise a thickness of about 0.1 to 2 mm, for example. The low thermal conductivity material 150 may comprise a thermal conductivity of about 2 W/m-K or less in some embodiments. Alternatively, the low thermal conductivity material 150 may comprise other ranges of thermal conductivity, dimensions, and materials, for example.

In embodiments wherein the low thermal conductivity material 150 comprises a ceramic material, the low thermal conductivity material 150 may comprise amorphous silicon dioxide ($SiO_2$) having a thermal conductivity of about 1.3 W/(m-K), or borosilicate glass having a thermal conductivity of about 2 W/(m-K), as examples. In embodiments wherein the low thermal conductivity material 150 comprises an organic material, the low thermal conductivity material 150 may comprise polyimide having a thermal conductivity of about 0.33 W/(m-K), or epoxy which has a thermal conductivity of about 0.3 W/(m-K), as other examples.

In FIG. 7, exemplary dimensions of the aperture 134 and the aperture 134 relative to the die 102 are also shown. The aperture 134 for the dies 102 comprises a width comprising dimension $d_1$ which is slightly wider than a width of the die 102. The aperture 134 may be larger on both sides of the die 102 by a predetermined dimension $d_2$. Dimension $d_1$ may comprise about 7 to 26 mm, and dimension $d_2$ may comprise about 0.1 to 10 mm, for example, although alternatively, dimensions $d_1$ and $d_2$ may comprise other values.

The low thermal conductivity material 150 reduces or prevents heat transfer to the packaging substrate 104. For example, when the packaging substrate 104 is exposed to heat 152 from a top surface of the substrate 104, the low thermal conductivity material 150 transfers little or no heat from the frame 132 of the jig 130 to the substrate 104, preventing the substrate 104 from warping or bending during the packaging process due to thermal expansion due to excessive temperature exposure.

Figure 8:
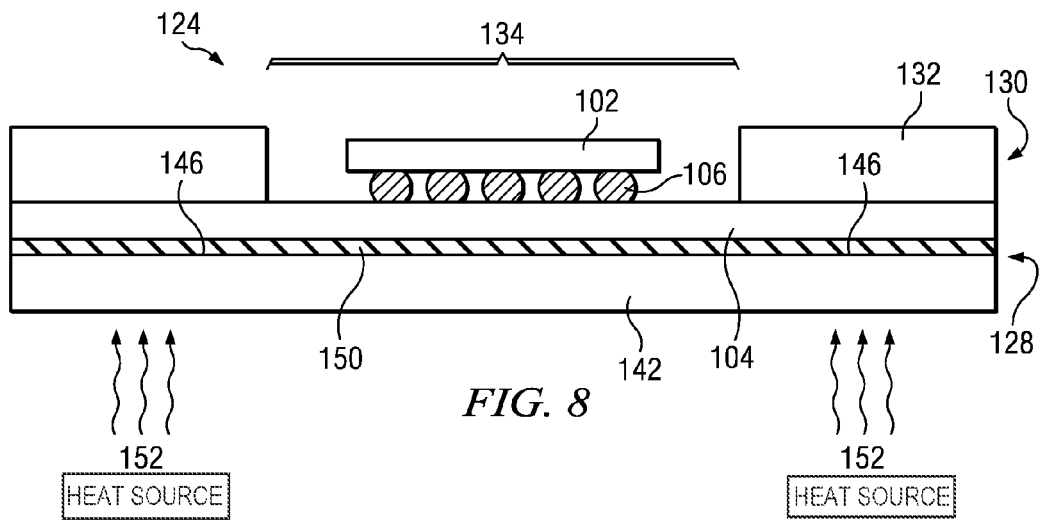

FIG. 8 shows an embodiment where the low thermal conductivity material 150 is disposed on the first side 146 of the support 128 for the packaging substrate 104. The low thermal conductivity material 150 may be attached to, deposited on, or coated onto the frame 142 of the support 128. When the packaging substrate 104 is exposed to heat 152 from a bottom surface of the substrate 104, the low thermal conductivity material 150 transfers little or no heat from the frame 142 of the support 128 to the substrate 104, also preventing the substrate 104 from warpage. The low thermal conductivity material 150 also transfers little or no heat from the frame 142 of the support 128 to the integrated circuit dies 102, advantageously.

Figure 9:
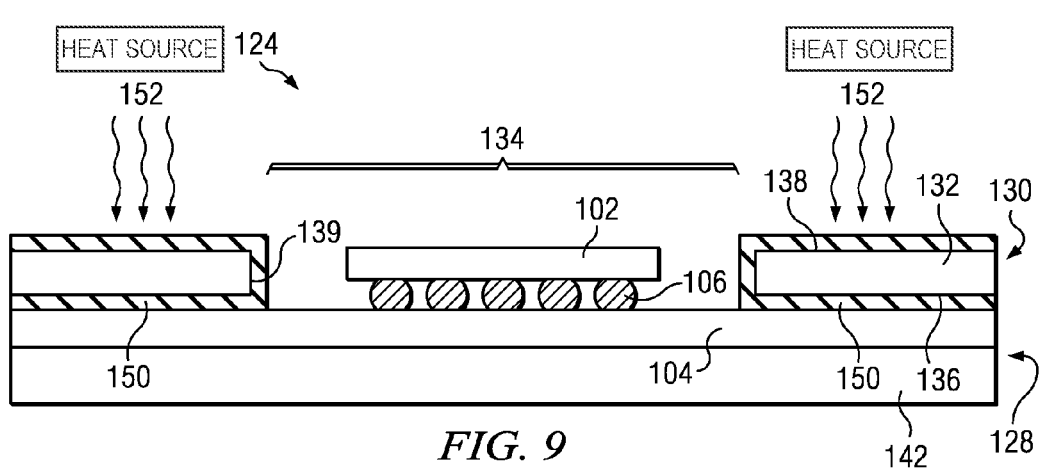
Figure 10:
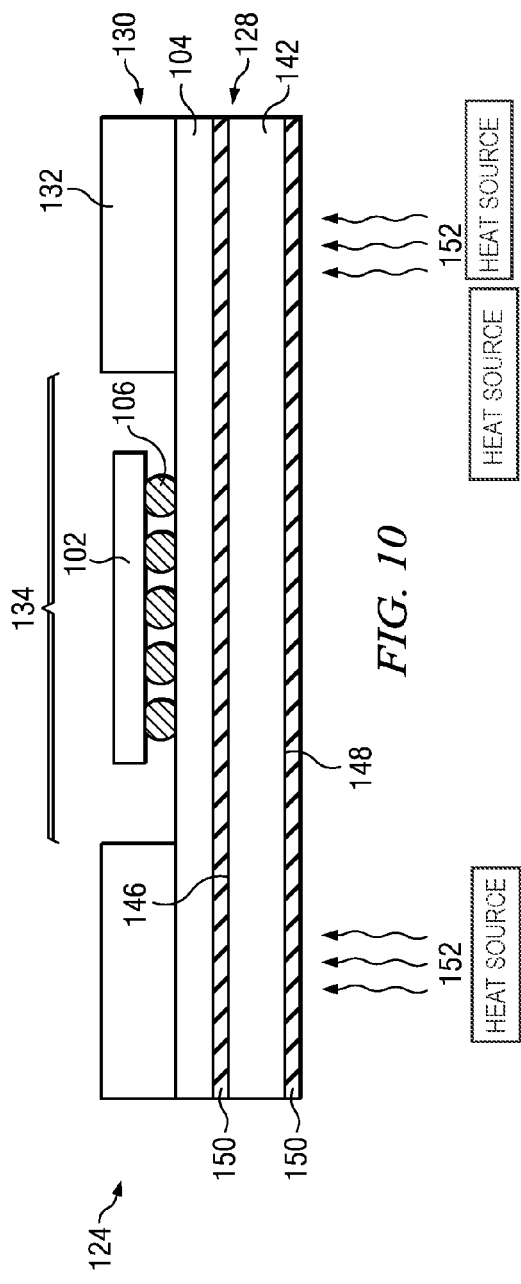

FIG. 9 shows another embodiment where low thermal conductivity material 150 is disposed on the first side 136 of the jig 130 and also on the second side 138 of the jig 130. The low thermal conductivity material 150 may optionally also be disposed on the sides 139 of the jig 130, as shown. The low thermal conductivity material 150 may be coated onto the frame 132 of the jig 130 in this embodiment, for example. Likewise, in another embodiment, the low thermal conductivity material 150 may be disposed on the first side 146 and the second side 148 of the support 128, as shown in FIG. 10. The same beneficial effects of reducing heat 152 transfer to the substrate 104 and dies 102 as described for the embodiments of FIGS. 7 and 8 are exhibited in these embodiments. Furthermore, in this embodiment, the heat 152 may advantageously be prevented or reduced in the frames 132 and 142 of the jig 130 and support 128, respectively.

Figure 11:
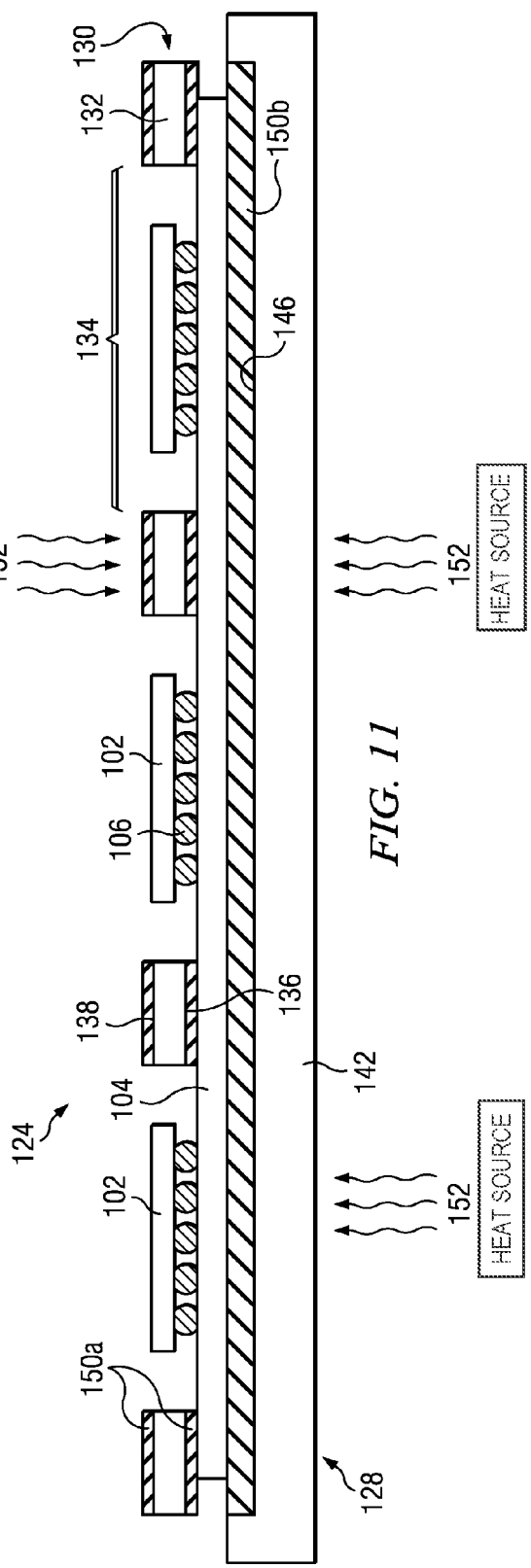

FIG. 11 shows another embodiment wherein the low thermal conductivity material 150a and 150b is disposed on both the jig 130 and the support 128, respectively. A plurality of die 102 is shown retained within the jig 130 in FIG. 11. The low thermal conductivity material 150b is formed on a portion of the support 128 proximate the substrate 104 in this embodiment, but not on edges of the support 128.

Forming the low thermal conductivity material 150 on the support 128 and/or jig 130 is advantageous in that mechanical stress is reduced during processes that the packaging substrate 104 and integrated circuit dies 102 are exposed to, such as thermal processes that may require a high temperature. The low thermal conductivity material 150 permits a transfer of less heat during thermal processes, which reduces or eliminates warpage in packaged integrated circuit die 160 (see FIG. 12), e.g., warping of the packaging substrate 104 and/or the integrated circuit dies 102 is reduced or prevented. Thus, the low thermal conductivity material 150 provides warpage behavior control during a solder reflow process and other thermal processes or packaging processes.

The solder reflow process using the packaging process system 124 described herein reflows the solder 114 of the bumps 106 and electrically couples the die 102 to the package substrate 104. Before the solder reflow process, the die 102 may be attached to the packaging substrate 104 using an adhesive, or the solder 114 may also function as a mechanical attachment to the package substrate 104. The bumps 106 of the integrated circuit die 102 may be coupled to bond pads 108 of the packaging substrate 104 using a solder process, solder reflow process, and/or thermal compression bonding, as examples. Alternatively, other methods may be used to electrically connect the integrated circuit die 102 to the packaging substrate 104.

Figure 12:
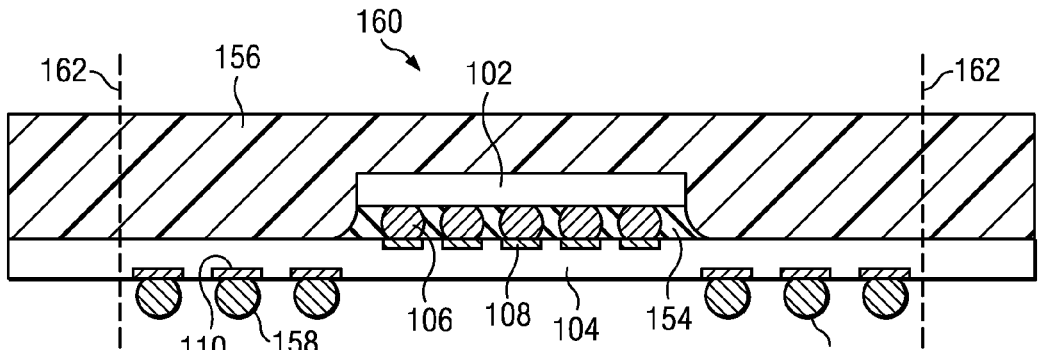
FIG. 12 shows a cross-sectional view of a packaged integrated circuit die after the completion of a packaging process utilizing the packaging process system and tools of embodiments described herein.

After the packaging process system 124 including the substrate 128 and 130 is used for a solder reflow process or other packaging process, the packaging of the integrated circuit die 102 is continued. An under-fill material 154 is formed under the integrated circuit die 102, as shown in FIG. 12 in a cross-sectional view. The under-fill material 154 may comprise a filler, an epoxy, a hardener, or multiple layers or combinations thereof, as examples, although alternatively, the under-fill material 154 may comprise other materials. The under-fill material 154 may comprise a material with a viscosity sufficient to flow at least partially, and in some embodiments, to flow completely beneath the integrated circuit die 102, for example. A molding compound 156 may optionally be formed over the integrated circuit die 102, the under-fill material 154, and the packaging substrate 104, also shown in FIG. 12. The molding compound 156 may comprise an epoxy, a filler, an organic material, or multiple layers or combinations thereof, for example, although the molding compound 156 may also comprise other materials. The molding compound 156 may extend above a top surface of the integrated circuit die 102 by about 10 μm or greater, for example. If the integrated circuit die 102 is large, a greater amount of molding compound 156 may be used, to provide more robustness for the package, in some embodiments. Solder balls 158 may be formed on contact pads 110 of the substrate 104, as shown. The packaged dies 160 are then singulated at the scribe lines or singulation lines 162, shown in phantom in FIG. 12, and the packaged dies 160 are separated from one another. The packaged semiconductor device 160 may optionally be attached using the solder balls 158 (or the contact pads 110, if the solder balls 158 are not included) to another device, printed circuit board (PCB), or other end applications.

Figure 13:
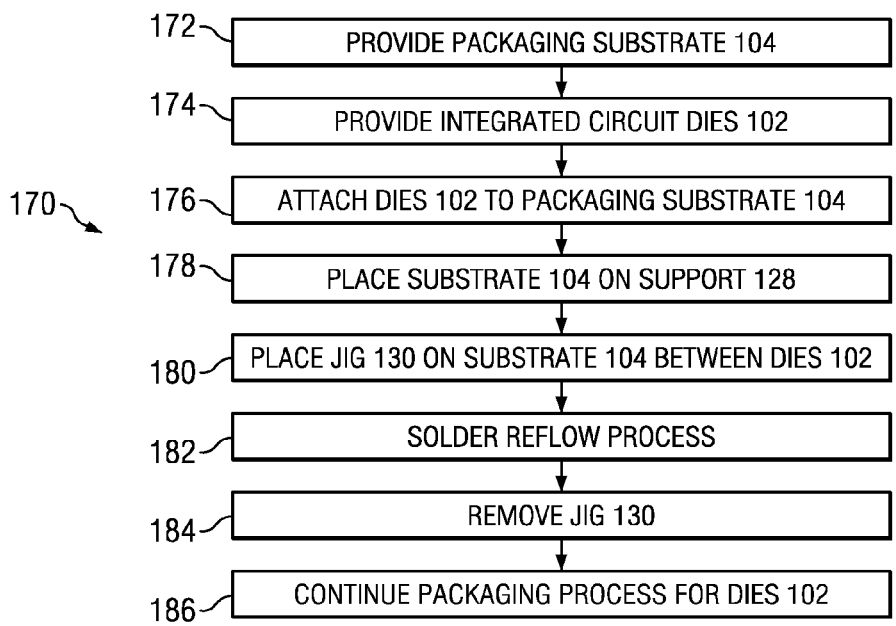
FIG. 13 is a flow chart illustrating a method of using the packaging process system and tools described herein to package a semiconductor device.

FIG. 13 is a flow chart 170 illustrating a method of packaging a semiconductor device 102 in accordance with an embodiment of the present disclosure utilizing the packaging process tools having a low thermal conductivity material 150, 150a, and/or 150b disposed thereon. The method includes providing a packaging substrate 104 (step 172). A plurality of integrated circuit dies 102 are provided (step 174), and the dies 102 are attached to the packaging substrate 104 (step 176). The packaging substrate 104 is placed on a support 128 of a packaging process system 124 (step 178; see FIG. 4), and a jig 130 is placed on the packaging substrate 104 proximate (e.g., between) the plurality of dies 102 (step 180). A solder reflow process (step 182) or other process is then used to electrically couple the dies 102 to the packaging substrate 104. The jig 130 is then removed (step 184), and the packaging process for the integrated circuit dies 102 is continued (step 186). Alternatively, the support 128 and the jig 130 of the packaging process system 124 may used for other processes in a packaging process flow for integrated circuits, for example.

Figure 14:
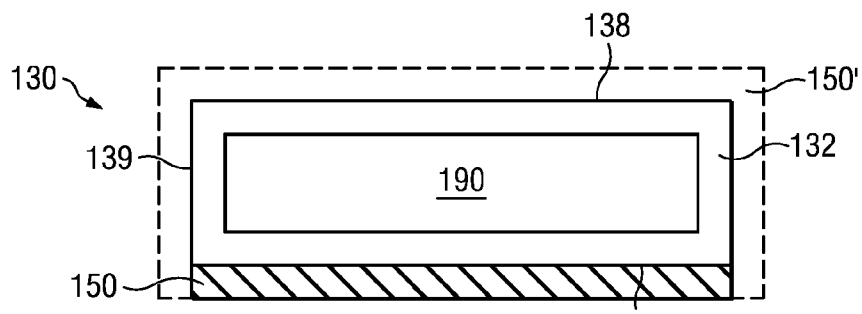
FIG. 14 is a cross-sectional view of an embodiment wherein the jig comprises a hollow region inside the frame and includes the low thermal conductivity material disposed thereon.

Embodiments of the present disclosure may also be implemented with jigs 130 that comprise a hollow region 190 inside the frame 132, as shown in FIG. 14. Hollow jigs are described in U.S. patent application Ser. No. 13/270,890, filed on Oct. 11, 2011 entitled, "Packaging Process Tools and Packaging Methods for Semiconductor Devices," which is incorporated herein by reference. The low thermal conductivity material 150 may be formed on the first side 136 of the frame 132 of the jig 130. The low thermal conductivity material 150 may optionally also be formed on the second side 138 of the frame 132 and/or the sides 139 of the frame 132 of the jig 130, as shown in phantom, in this embodiment. Embodiments of the present disclosure are particularly advantageous when implemented using a hollow jig 130 because the hollow region 190 of the jig 130 reduces heat transfer, and the low thermal conductivity material 150 further reduces heat transfer to a packaging substrate 104 and/or dies 102.

Advantages of embodiments of the disclosure include providing novel packaging techniques that have increased reliability and higher yields due to the use of the packaging process tools, i.e., the supports 128 and/or jigs 130 having the low thermal conductivity material 150 disposed thereon in accordance with embodiments described herein. In embodiments where the support 128 for the packaging substrate 104 has the low thermal conductivity material 150 disposed thereon, the support 128 prevents or reduces heat transfer to the packaging substrate 104 and dies 102. In embodiments wherein the jig 130 has the low thermal conductivity material disposed thereon, the jig 130 maintains mechanically the correct positional relationship of the integrated circuit dies 102 and the packaging substrate 104 during the packaging processing while also preventing or reducing heat transfer to the packaging substrate 104. Warping and bending effects of the packaging substrate 104 and/or the dies 102 during thermal stress such as solder reflow processes are reduced or eliminated by embodiments of the disclosure described herein, due to the reduction in thermal expansion in the packaging substrate 104 during the solder joint formation. The supports 128 and/or jigs 130 reduce thermal conduction, CTE mismatch, and thermal expansion. Joint reliability is improved, by reducing or preventing shorts from bridging or opens from cracks in the solder joints between the bumps 106 and bond pads 108. Cracks or cold joints in connections of the bumps 106 and delaminations of the various material layers of the package (which may comprise low dielectric constant (k) material layers) are reduced or minimized, improving reliability. The novel packaging methods for semiconductor devices 102 are easily implemented in manufacturing and packaging process flows.

In one embodiment, a packaging process tool for semiconductor devices includes a mechanical structure for supporting package substrates or integrated circuit die during a packaging process for the integrated circuit die. The mechanical structure includes a low thermal conductivity material disposed thereon.

In another embodiment, a packaging process system includes a support for a packaging substrate and a jig coupleable to the support for the packaging substrate. The jig is adapted to cover the packaging substrate on the support and comprises a plurality of apertures for retaining a plurality of integrated circuit dies onto the packaging substrate. The support for the packaging substrates or the jig comprises a low thermal conductivity material disposed thereon.

In yet another embodiment, a method of packaging a semiconductor device includes providing a packaging substrate, providing a plurality of integrated circuit dies, and attaching the plurality of integrated circuit dies to the packaging substrate. The packaging substrate is placed on a support, and the packaging substrate is covered with a jig proximate the plurality of integrated circuit dies. A packaging process is performed on the plurality of integrated circuit dies and the packaging substrate. The support or the jig comprises a low thermal conductivity material disposed thereon.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging process tool for semiconductor devices, comprising:
    a mechanical structure for supporting package substrates or integrated circuit die during a packaging process for the integrated circuit die, wherein the mechanical structure includes a low thermal conductivity material disposed thereon; and
    wherein the mechanical structure comprises a jig, the jig comprising a frame including a plurality of apertures adapted to retain a plurality of integrated circuit dies therein.

2. The packaging process tool according to claim 1, wherein the jig comprises a hollow region.

3. The packaging process tool according to claim 1, wherein the mechanical structure comprises a supporting boat.

4. The packaging process tool according to claim 3, wherein the supporting boat is adapted to support a bottom surface of the packaging substrate.

5. The packaging process tool according to claim 1, wherein the low thermal conductivity material comprises a material selected from the group consisting essentially of a ceramic material, an organic material, a plastic material, silicone rubber, or combinations thereof.

6. The packaging process tool according to claim 1, wherein the mechanical structure comprises a first side, and wherein the low thermal conductivity material is disposed on the first side of the mechanical structure.

7. The packaging process tool according to claim 6, wherein the mechanical structure comprises a second side opposite the first side, and wherein the low thermal conductivity material is disposed on the second side of the mechanical structure.

8. A packaging process tool for semiconductor devices, comprising:
    a mechanical structure for supporting a package substrate during a packaging process; and
    a jig coupleable to the mechanical structure, wherein the jig is adapted to cover the packaging substrate and the jig comprises a plurality of apertures for retaining a plurality of integrated circuit dies onto the packaging substrate, wherein the mechanical structure or the jig or both comprises a low thermal conductivity material disposed thereon.

9. The packaging process tool according to claim 8, wherein both the mechanical structure and the jig comprise the low thermal conductivity material disposed over a major surface thereof.

10. The packaging process tool according to claim 8, wherein the low thermal conductivity material comprises a thermal conductivity of less than about 2 W/m-K.

11. The packaging process tool according to claim 8, wherein the packaging process tool is adapted to implement a thermal process for packaging the plurality of integrated circuit dies.

12. The packaging process tool according to claim 8, wherein the low thermal conductivity material is a coating over the mechanical structure or the jig.

13. The packaging process tool according to claim 8, wherein the jig comprises a frame comprising a first material, wherein the low thermal conductivity material comprises a second material, and wherein the second material is different than the first material.

14. A packaging process tool for semiconductor devices, comprising:
a mechanical structure including
a first support adapted to support a packaging substrate,
a second support adapted to retain an integrated circuit die onto the packaging substrate,
a low thermal conductivity material coating a major surface of the first support, the second support, or both the first and second support; and
a heat source for directing heat toward the first support, the second support, or both the first and second support.

15. The packaging process tool according to claim 14, wherein the low thermal conductivity material is selected from the group consisting of a ceramic material, an organic material, a plastic material, silicone rubber, and combinations thereof.

16. The packaging process tool according to claim 14, further comprising a package substrate on the first support and an integrated circuit die retained by the second support.

17. The packaging process tool according to claim 8 further comprising a heat source for directing heat toward the mechanical structure, the jig or both the mechanical structure and the jig.

18. The packaging process tool according to claim 1 further comprising a heat source for directing heat toward the mechanical structure.

19. The packaging process tool according to claim 8 wherein the jig comprises a hollow region.

20. The packaging process tool according to claim 8, wherein the mechanical structure comprises a frame including a plurality of apertures adapted to retain a plurality of integrated circuit dies therein.

* * * * *